United States Patent [19]

Neale et al.

[11] 4,228,524
[45] Oct. 14, 1980

[54] MULTILEVEL SEQUENCE OF ERASE PULSES FOR AMORPHOUS MEMORY DEVICES

[75] Inventors: Ronald G. Neale, Beeches, England; Grady M. Wood, Melbourne, Fla.

[73] Assignee: Harris Corporation, Melbourne, Fla.

[21] Appl. No.: 5,944

[22] Filed: Jan. 24, 1979

[51] Int. Cl.$^2$ ............................................... G11C 7/00
[52] U.S. Cl. ........................................ 365/163; 357/2
[58] Field of Search ...................... 365/163, 159; 357/2

[56] References Cited

U.S. PATENT DOCUMENTS

| | | | |
|---|---|---|---|
| 3,827,033 | 7/1974 | Quilliam | 365/163 |
| 3,846,767 | 11/1974 | Cohen | 365/163 |
| 3,875,566 | 4/1975 | Helbers | 365/163 |
| 3,886,577 | 5/1975 | Buckley | 365/163 |
| 3,922,648 | 11/1975 | Buckley | 365/163 |

FOREIGN PATENT DOCUMENTS 1372414 10/1974 United Kingdom ................. 365/159

OTHER PUBLICATIONS

Manhart et al., Automatic 'try and verify' Circuit to Investigate the Reliability of Memory Switching in Amorphous Materials, Journal of Physics E: Scientific Instruments, 1975, vol. 8, pp. 317–321.

*Primary Examiner*—Stuart N. Hecker
*Attorney, Agent, or Firm*—Leitner, Palan, Lyman, Martin & Bernstein

[57] ABSTRACT

The Write/Erase lifetime of amorphous memory devices are extended by applying an erase pulse sequence having a first plurality of reset voltage pulses having a maximum amplitude less than the maximum threshold of the device to produce first amplitude current pulses and a second plurality of reset voltage pulses having a maximum amplitude greater than the maximum threshold to produce second amplitude current pulses having an amplitude substantially less than said current pulses. Constant current sources apply the two current pulses when the device threshold is below the maximum voltage amplitude of the first reset voltage pulses and only the second amplitude current pulses when the device threshold exceeds the maximum voltage amplitude of the first reset voltage pulses.

21 Claims, 6 Drawing Figures

U.S. Patent  Oct. 14, 1980  4,228,524
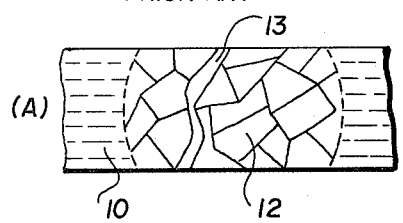
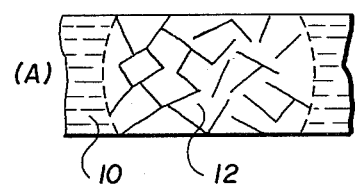
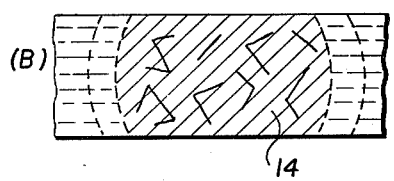
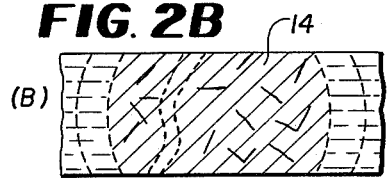
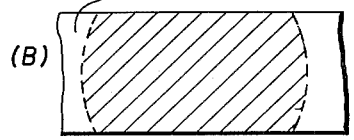
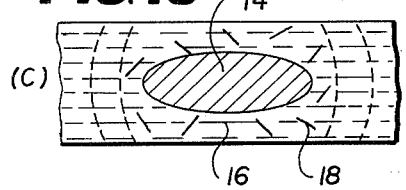
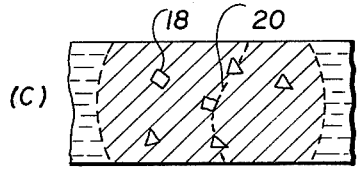
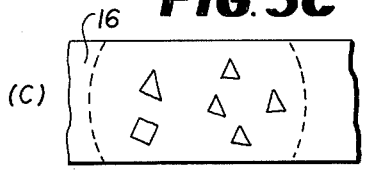
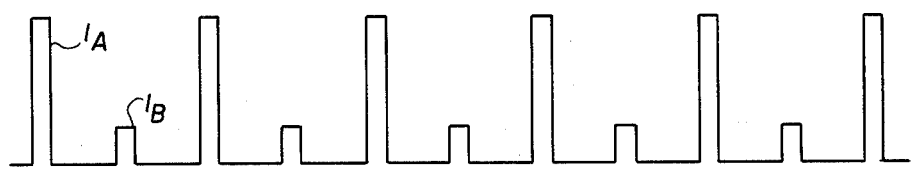
FIG. 4
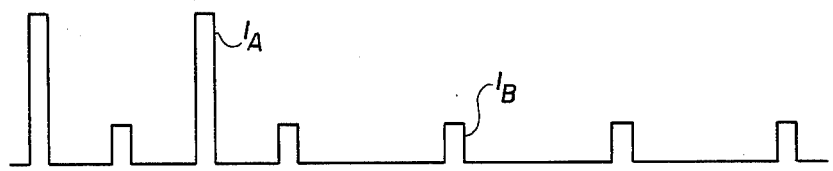
FIG. 5
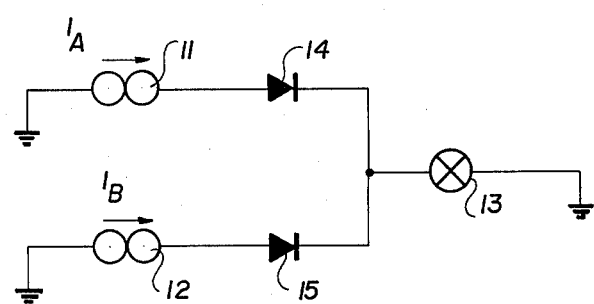
FIG. 6

MULTILEVEL SEQUENCE OF ERASE PULSES FOR AMORPHOUS MEMORY DEVICES

BACKGROUND OF THE INVENTION

The present invention relates generally to methods of resetting or erasing amorphous memory devices and more specifically to an improved method of resetting or erasing amorphous devices while minimizing electromigration.

Amorphous semiconductor memory devices, for example a tellurium based chalcogenide glass, are well known. These memory devices are generally bistable devices, the film of memory semiconductor material is capable of being switched from a stable high resistance condition into a stable low resistance condition when a write or set voltage pulse of relatively long duration (e.g., $\frac{1}{2}$-100 milliseconds or more) is applied. Such a set voltage pulse causes current to flow in a small filament (generally under 10 microns in diameter). The set or write current pulse generally heats regions of the semiconductor material above its glass transition and to its crystallization temperature. The consequence is that the material crystallizes around and in the region of the conducting filament. Set current pulses are commonly of a value of from 0.5 milliamperes to about 15 milliamperes, although they are generally well under 10 milliamperes for most memory applications. The magnitude of the set current pulse is determined by the open circuit amplitude of the set voltage pulse and the total series circuit resistance involved including the memory device. A crystallized low resistance filament remains indefinitely, even when the applied voltage and current are removed, until reset or erased to its initial amorphous high resistance condition.

The set crystallized filament in the semiconductor materials can generally be erased or reset by applying one or more reset current pulses of relatively short duration, such current pulses are of the order of 10 microseconds duration. The reset or erase current pulses heat the entire filament of the semiconductor material to a temperature above the crystallization and melting temperatures of the material. In this condition, the crystalline filament is melted or otherwise reformed into the original amorphous mass. When such a reset current pulse is terminated, the material quickly cools and leaves a generally amorphous composition like the original one. Sometimes, it takes a number of reset current pulses to convert a previous set filament to what appears to be a fully reset state.

While the resistance and threshold voltage values of a reset filament region may indicate it has apparently been fully reset to its original amorphous composition (except for some non-resettable crystallites which ensure that subsequent crystalline filaments are formed in the same place), the reset filament region often is non-homogeneous, with the crystallizable elements like tellurium in various degrees of concentration. This produces threshold voltage degredation when the device is stored at elevated temperatures because the materials rich in tellurium crystalize at low temperatures.

This problem has been partially overcome by feeding a number of additional reset current pulses through an apparently fully reset filament region, which further homogenizes the region, as disclosed in U.S. Pat. No. 3,846,767. This patent describes a reset procedure utilizing eight, 150 milliamperes reset current pulses spaced apart 100 microseconds. The use of such high reset current pulses to reset and homogenize the memory semiconductor material of memory devices severly limits the practical applications of memory devices in memory arrays where cost and size restrictions require high packing densities having maximum current ratings of under 50 milliamperes and sometimes under 10 milliamperes. Thus, it becomes of great importance to be able to reliably reset a memory device used in such memory arrays with reset current pulses of under 50 milliamperes, and preferably under 10 milliamperes.

These additional current pulses, while solving one problem, introduce a second. This second problem is the reduction of the write/erase lifetime on the number of write/erase cycles before the threshold voltage of the device has reduced below an acceptable level (i.e., the device fails).

This threshold degradation is caused in a germanium-tellurium memory semiconductor composition by electromigration of tellurium during the flow of reset current. The degree of which degradation is directly related to the current density involved. Such electromigration of tellurium builds up a progressively greater thickness of crystalline tellurium next to one of the electrodes involved, which progressively reduces the threshold voltage value of the memory switch device.

U.S. Pat. No. 3,875,566 discloses that amorphous devices could be erased by the use of a burst of a large number of reset current pulses each of an amplitude which was believed to be only a small fraction of the amplitude thought necessary to effect resetting of the entire filamentous path. The reset current pulses used in the practice of this resetting technique were generated by a constant current source clamped at a voltage limited to a value below the threshold voltage of the fully reset memory device. This technique acts so as to stablize the threshold voltage values of all the memory switch devices to which the current source was applied at identical or near identical values, despite the somewhat varying threshold voltage values of the various particular memory devices of the array. Since the threshold voltage valve of a filament being progressively reset gradually increases with the degree of reset achieved, when the threshold voltage value of the partially reset filament of the memory device being reset exceeds the maximum possible voltage output of the constant current reset source, purposefully set below the maximum possible value thereof, the memory switch device cannot be rendered conductive by any subsequently generated reset voltage pulses, and so no further reset action is possible. It is not then possible to effect the maximum degree of rehomogenization of the filament region since under this reset procedure the device is never fully reset and does not receive reset current pulses which homogenize a fully reset filament.

U.S. Pat. No. 3,886,577 attempts to stablize threshold voltage of a filament type memory device by providing adjacent the positive electrode a substantially enrichment of tellurium in a germanium-tellurium composition. The initial enrichment with tellurium of the area next to the positive electrode reduces the number of set and reset cycles to achieve what was thought to be a stable equilibrium of electromigration and diffusion. While an advantageous initial threshold stablization was achieved in a few set and reset cycles, it was subsequently discovered that the threshold voltage stablization observed did not in fact continue indefinitely.

U.S. Pat. No. 3,922,648 discloses a resetting method comprising a burst of reset current pulses at least in the neighborhood of about 10 pulses. Each pulse is substantially under 10 microseconds in duration and the pulses in each burst are spaced apart substantially under 10 microseconds, which is less than two and preferably of the order of one thermal time constant or less of the device, so that the filament region involved does not substantially completely cool to ambient temperature between reset pulses, but rather reaches a temperature intermediate the reset and ambient temperatures. The patent theorized that threshold degradation is due to an imbalance between electromigration of tellurium during flow of reset current and diffusion thereof in the other direction between reset pulses. For reset current pulses spaced apart less than than the thermal time constant of the amorphous semiconductor film involved, the filament region is still hot when the next reset pulse arrives. Consequently, an area of higher conductivity exists which results in a lower maximum current density and reduced electromigration. With such reduced electromigration, the diffusion which exists after termination of each reset pulse balances out the amount of electromigration during the flow of reset current. In such case, the intial low amplitude reset current pulses fully reset the filament path and the following low amplitude reset current pulses homogenize the filament path.

While the method of this patent minimizes current spikes from the threshold switching that occur on each erase pulse, it does not provide the most effective erase. Neither does it remove two other causes of electromigration. Namely the overdriving occurring on the first pulse of an erase sequence and the overdriving occurring from localization of current after switching, while adding the burden of maintaining precision in the timing of the erase pulse spacing. A model of a device operating according to the method of U.S. Pat. No. 3,922,648 is illustrated in FIG. 1A, B and C. A semiconductor substrate includes a semiconductor amorphous device 10 which is illustrated in FIG. 1A as including a crystalline, ordered filament 12. Path 13 is the region where initial maximum current density is realized. On application of the reset pulse, the filament 12 is heated to above the phase change temperature and the crystals returned to the amorphous state at a melt or revitrifying temperature as illustrated in FIG. 1B as 14. As the filament 12 cools, the area 14 contracts axially and radially. This is illustrated in FIG. 1C. The cooled area is basically converted back to an amorphous material 16 having small localized crystalline 18 therein. Using the appropriately spaced pulses of the sequence of the patent, the area 14 in FIG. 1C is never allowed to disappear until the end of the sequence. Thus during the subsequent erase pulses in the sequence, area 14 expands axially and radially. As stated previously, this technique does not eliminate overdrive along a preferred path or of the whole crystal filament on the first pulse of sequence nor during localization after switching of subsequent pulses.

Thus there exists a need of a method of resetting amorphous memory devices which minimizes electromigration addressing all three overdriving causes thereof while providing the practical advantages of low current and an independence from timing constraints.

In our application titled "Multilevel Erase Pulse for Amorphous Memory Devices", filed simultaneously with the present application, a single multilevel erase pulse is disclosed as an optimum single pulse to minimize electromigration over the whole erase sequence. Since the single pulse included high and low level current amplitudes for the first as well as the last pulse in the sequence, overdrive is present during the later pulses in the sequence. Although it reduces electromigration and extends the erase/write lifetime of amorphous memory devices, additional minimizing of electromigration is desirable.

SUMMARY OF THE INVENTION

The resetting method of the present invention minimizes electromigration to extend the write/erase lifetime of amorphous memory devices by using an erase resetting sequence having at least two different level pulses of different maximum voltage levels. The first type of reset pulse in the sequence is a reset voltage pulse having a maximum amplitude below the maximum threshold value of an amorphous memory device to produce a reset current pulse of a first constant amplitude. A second type of reset voltage pulses in the sequence has a maximum amplitude above the maximum threshold voltage of the amorphous memory device to produce reset current pulse of a second constant amplitude less than the first amplitude. Both current pulses are applied to the amorphous memory device until the threshold value of the erase memory device exceeds the maximum amplitude of the first reset voltage pulse. During subsequently applied reset voltage pulses in the sequence, only the second current amplitude is applied. By selecting the first current amplitude to be relatively large compared to the second current amplitude, the amorphous device is efficiently erased by the large current and low current amplitude pulses before the maximum threshold of the amorphous memory device is reached and only the low current pulses are effective near the maximum threshold value of the amorphous memory device of homogenize the amorphous memory structure without overdriving the same. This reduces and minimizes electromigration. Preferably the first and second type of voltage pulses are applied alternately in the sequence, the first voltage pulses have a maximum amplitude no greater than 80 percent of the maximum theshold voltage of the amorphous device, and the first reset current amplitude may be eight times the set current and the second current amplitude may be twice the set current.

OBJECTS OF THE PRESENT INVENTION

An object of the present invention is to provide a reset pulse sequence which extends the write/erase lifetime of amorphous memory devices.

Another object is to provide an erase sequence using at least two level current pulses of different maximum voltage levels to minimize electromigration.

A further object of the invention is to provide a reset sequence which minimizes electromigration with a minimum amount of circuitry to produce the sequence.

Other objects, advantages and novel features of the present invention will become apparent from the following detailed description of the invention when considered in conjunction with the accompanying drawings.

BRIEF DESCRIPTION OF THE DRAWINGS

FIGS. 1A, B and C are cross-sectional views of an amorphous semiconductor material memory device illustrating the erase process of the prior art.

FIGS. 2A, B and C are cross-sectional views of an amorphous semiconductor material memory device illustrating the erase process of the present invention by the first erase pulse of an erase sequence.

FIGS. 3A, B and C are cross-sectional views of an amorphous semiconductor material memory device illustrating the erase process by subsequent erase pulses of an erase sequence.

FIG. 4 illustrates a reset current pulse sequence incorporating the principles of the present invention.

FIG. 5 illustrates the reset current pulses of the sequence of FIG. 4 which are conducted through an amoprhous memory device.

FIG. 6 is a schematic of a circuit capable of producing the sequence illustrated in FIGS. 4 and 5.

DESCRIPTION OF THE PREFERRED EMBODIMENTS

There are three main requirements of the pulse used to erase an amorphous memory device. The first is that the state and temperature of the crystallized material is changed to allow the material to return, by diffusion, to a homogeneous amorphous state. Second, a sufficient time be provided for diffusion. Thirdly, that the immediate local environment is maintained in a condition that by quenching, allows the vitreous state to be frozen as amorphous when the erase sequence is terminated.

The optimization of the erase pulse sequence requires that the erase be achieved with a minimization of power (current), time, increase in local temperature, electromigration effects (current density) while maximizing the probability of an erase and the permanency of the erase condition at the highest possible temperature.

The optimization of the erase pulse sequence using a minimum of different level erase pulses is compounded by the fact that during a single erase sequence, each pulse sees a slightly different device as the erase process progresses. Although sophisticated adaptive systems would provide the greatest optimization, a majority of applications would eliminate these devices because of expense and space limitations.

The memory device prior to an erase pulse is illustrated in FIG. 2. FIG. 2A consists of a column of crystallites 12 all touching and surrounded by an annulus of amorphous material 10. The initial action of the erase pulse is to raise the temperature of the crystallites to the phase change temperature of the material and then supply sufficient energy for the phase change to take place. As illustrated in FIG. 2B a hot column 14 is initially formed in the crystallite 12 and expands radially to the radius of the original crystallite area 12 and beyond. Upon quenching the erase pulse, the crystallite material 12 remains vitreous leaving an amorphous area 16 of approximately the same radius as the original crystallite of area 12 and can include a plurality of localized, non-touching crystallites 18 therein. This condition is illustrated in FIG. 2C. Also illustrated therein is a dotted line 20 illustrating a conductor path between nontouching crystallites which is the source of initial conduction during subsequent erase pulses in the erase sequence.

Within two or three pulses, sufficient erase will have occured to separate the remaining crystallites by amorphous material and subsequent reset pulses will necessitate switching this amorphous material before a significant current can flow. Switching in the conventional manner will initially cause the current to flow down the path of lowest breakdown voltage and thus an embryo hot filament will be driven both by the constant current source plus the capacitive discharge current resulting from the switching transients. This occurs until the filament has expanded to the equilibrium condition. FIG. 3A illustrates this phemenon wherein the hot embryo filament 14 is formed in the substantially amorphous material 16 and it expands to to the extremeties of the amorphous material 16 as illustrated in FIG. 3B. Upon quenching by termination of the erase pulse, the material cools to a completely amorphous material 16.

After the first pulse, the amount of resetting of the crystalline material to the amorphous state increases and consequently the threshold voltage of the device increases. It is desirable to have the sequence which has sufficiently high current pulses in the beginning of a sequence capable of resetting as much of the amorphous material as possible as quickly as possible followed by lower current pulses which will not overdrive the amorphous device yet will deliver sufficient energy to homogenize the amorphous material.

The present invention recognizing this design criteria provides an optimum sequence including two different level current pulses which are operative in combination during the early stages of resetting with only the smaller current pulse being applied during the remainder of the sequence near the maximum threshold voltage of the amorphous memory device to achieve homogenization.

The reset method of the present invention uses two current pulses $I_A$ and $I_B$ in alternation as illustrated in FIG. 4. The pulses may be, for example, one microsecond in duration and approximately five microseconds apart. The current pulse $I_A$ may have an amplitude, for example, of four to eight times the current used in the setting or writing operation and the current pulse $I_B$ having an amplitude of approximately twice the setting or writing current. These are mere examples and the duration of the pulses may be in the range of 1 microseconds to 10 microseconds with a separation of 3 microseconds to 20 microseconds and $I_A$ may have an amplitude in a range of 10 milliamperes to 50 milliamperes and $I_B$ in a range of 5 milliamperes to 25 milliamperes. The main consideration is that the current pulse $I_A$ be sufficiently large to provide sufficient energy to reset without overdrive while $I_B$ will be small enough to produce a minimum resetting and a maximum homogenization after the amorphous memory device is reset to the maximum threshold.

The current pulses of FIG. 4 are produced by two parallel current sources 11 and 12 connected to the amorphous device 13 through isolating diodes 14 and 15 respectively, as illustrated in FIG. 6. Since it is desirable that the high amplitude constant current source 11, which produces high amplitude current pulse $I_A$, is only effective during the initial stages of resetting and not once the amorphous memory device is substantially reset. The maximum voltage limit of the current source $I_A$ is selected to be below the maximum threshold voltage of the amorphous memory device 13 illustrated in FIG. 6. Preferably the voltage limit of constant current source 11 is 70 percent of the maximum threshold voltage of the amorphous memory device 13. This value is only an example, the voltage limit of constant current source 11 could be a range of 25 to 95 percent of the maximum threshold voltage of the amorphous memory device 13, although it is preferred not to exceed 80 percent. Since the current pulse $I_B$ is to be effective during the total erase sequence, the maximum voltage limit of constant current source 12 is selected to be greater than the maximum threshold voltage of the amorphous memory device 13.

A typical erase sequence, illustrated in FIG. 4, is produced by the constant current sources 11 and 12 having appropriate spacing between the pulses to produce the alternating sequence. As the set amorphous memory devices receive the erase pulses $I_A$ and $I_B$, the amorphous memory device is progressively reset from a crystalline to an amorphous material. The threshold voltage increases until it exceeds, for example, 70 percent of the maximum threshold voltage at which point, the constant current source 11 is ineffective to produce the current pulse $I_A$ since it can not switch the amorphous memory device. This is illustrated in FIG. 5 wherein only two large amplitude current pulses $I_A$ are transmitted through the amorphous memory device 13. The subsequent erase sequence includes only the small amplitude current pulses $I_B$ which are effective to continue the resetting sequence causing the threshold voltage device to become the maximum threshold voltage and to homogenize the material by the subsequently applied smaller current pulses $I_B$.

The constant current sources 11 and 12 may be simply voltage sources with a resistances in series. With the amorphous device 13 connected in series with the voltage source, the amorphous device 13 acts as a threshold switch. Once the threshold voltage or voltage necessary to switch amorphous device 13 exceeds the voltage source of the constant current source, the amorphous device will not switch to a low impedance state. The high impedance of the amorphous device will substantially prevent any current from being produced by the constant current source.

The present reset sequence accomplishes phase change with high current pulses and automatically terminate the high current pulses when the threshold of the device reaches a predetermined level below the maximum threshold. The low current pulse is continued to the end of the erase sequence and provides time for the rediffusion of the impurities in the material that were in a crystallized state prior to the erase sequence. This method assures that the erase will be accomplished and minimizes the current time integral or overdrive which results in minimum electromigration and maximum write/erase lifetime. By providing an alternating pulse sequence, the history of the device need not be known nor must the device be specifically designed for a specific amorphous memory material. The device is thus adapative for any type of memory material at any stage of set or reset. The pulse width and spacing are determined from the thermal characteristics of the amorphous material used.

From the preceding description of the preferred embodiments, it is evident that the objects of the invention are attained. Although the invention has been described and illustrated in detail, it is to be clearly understood that the same is by way of illustration and example only and is not to be taken by way of limitation. The spirit and scope of this invention being limited only by the terms of the appended claims.

What is claimed:

1. A method of resetting a filament-type memory device including spaced electrodes between which extend a body of generally amorphous substantially nonconductive memory semiconductor material which, when a set voltage pulse in excess of a given threshold voltage value and duration is applied to said electrodes, has formed therein a crystalline low resistance filamentous path resettable into a generally amorphous condition by application of one or more voltage pulses producing reset current pulses through said filamentous path to change the phase of the crystalline filament and are of a duration which is so short that upon termination of each reset current pulse the filamentous path will be quickly quenched to leave at least portions of the filamentous path in a substantially amorphous condition, said method comprising: applying to said electrodes a sequence of reset voltage pulses which produce a sequence of reset current pulses, a first plurality of reset voltage pulses in said sequence having a maximum amplitude below said give threshold voltage value to produce reset current pulses of a first constant amplitude, and a second plurality of reset voltage pulses in said sequence having a maximum amplitude above said given threshold voltage value to produce reset current pulses of a second constant amplitude less than said first consent amplitude.

2. The method of claim 1 wherein said first plurality of reset voltage pulses alternate with said second plurality of reset voltage pulses in said sequence.

3. The method of claim 1 wherein said first current amplitude is at least twice said second current amplitude.

4. The method of claim 3 wherein said second current amplitude is at least twice the amplitude of the current produced by said set voltage pulses.

5. The method of claim 1 wherein said first plurality of reset voltage pulses have a maximum amplitude of no greater than 80 percent of said given threshold voltage value.

6. A method of resetting a filament-type memory device including spaced electrodes between which extend a body of generally amorphous substantially nonconductive memory semiconductor material which, when a set voltage pulse in excess of a given threshold voltage value and duration is applied to said electrodes, has formed therein a crystalline low resistance filamentous path resettable into a generally amorphous condition by application of one of more voltage pulses producing reset current pulses through said filamentous path which progressively changes the phase of the crystalline filament and returns the same to a generally amorphous state, said progressive change of state of the crystalline filament causing said partially reset filament to have a progressively increasing resistance and threshold voltage value reaching a maximum threshold voltage value when substantially the entire filament is converted to its amorphous condition, said method comprising: applying to said memory device during each resetting sequence a first plurality of reset voltage pulses having ultimately a given maximum predetermined magnitude less than the maximum threshold voltage of said memory device to produce reset current pulses of a first amplitude as long as the magnitude of the reset voltage pulses remains in excess of the threshold voltage value of the memory device being reset and,
  a second plurality of reset voltage pulses having ultimately a given maximum predetermined magnitude greater than the maximum threshold voltage value of said memory device to produce reset current pulses of a second amplitude for each of the second plurality of reset voltage pulses.

7. The method of claim 6 wherein said first plurality of reset voltage pulses alternate with said second plurality of reset voltage pulses in said sequence.

8. The method of claim 6 wherein said first current amplitude is at least twice said second amplitude.

9. The method of claim 8 wherein said second current amplitude is at least twice the amplitude of the current produced by said set voltage pulses.

10. The method of claim 6 wherein said first plurality of reset voltage pulses have a maximum predetermined magnitude no greater than 80 percent of the maximum threshold value of the memory device.

11. In a circuit having a filament-type memory device including spaced electrodes between which a body of generally amorphous substantially non-conductive memory semiconductor material which, when a set voltage pulse in excess of a given threshold voltage value and duration is applied to said electrodes has formed therein, a crystalline low resistance filamentous path resettable into a generally amorphous condition by application of one or more reset voltage pulses producing reset current pulses through said filamentous path to change the phase of the crystalline filament and are of a duration which is so short that upon termination of each reset current pulse the filamentous path will be quickly quenched to leave at least portions of the filamentous path in a substantially amorphous condition; and means connected to said electrodes for applying a sequence of reset voltage pulse or pulses which produces a reset current pulse or pulses which substantially completely convert the crystalline filamentous path to a substantially amorphous filamentous path, the improvement being said means which comprises in first means for applying a first plurality of reset voltage pulses in said sequence having a maximum amplitude below said give threshold voltage value to produce reset current pulses of a first constant amplitude; and a second means for applying a second plurality of reset voltage pulses in said sequence having a maximum amplitude above said given threshold voltge value to produce reset current pulses of a second constant amplitude less than said first constant amplitude.

12. The circuit of claim 11 wherein said first means and second means apply said first plurality of reset voltage pulses alternate with said second plurality of reset voltage pulses in said sequence respectively.

13. The circuit of claim 11 wherein said first current amplitude is at least twice said second amplitude.

14. The circuit of claim 13 wherein said second current amplitude is at least twice the amplitude of the current produced by said set voltage pulses.

15. The circuit of claim 11 wherein said first plurality of reset voltage pulses have a maximum amplitude of no greater than 80 percent of said given threshold voltage value.

16. The circuit of claim 11 wherein said first and second means are constant current sources.

17. In a circuit having a filament-type memory device including spaced electrodes between which extend a body of generally amorphous substantially nonconductive memory semiconductor material which, when a set voltage pulse in excess of a given threshold voltage value and duration is applied to said electrodes, has formed therein a crystalline low resistance filamentous path resettable into a generally amorphous condition by application of one or more voltage pulses producing reset current pulses through said filamentous path which progressively changes the phase of the crystalline filament and returns the same to a generally amorphous state, said progressive phase change of the crystalline filament causing said partially reset filament to have a progressively increasing resistance and threshold voltage value reaching a maximum threshold voltage value when substantially the entire filament is converted to its amorphous condition and means connected to said electrodes for applying a sequence of reset voltage pulses which produce reset current pulses, the improvement being said means which comprises;
first means for applying a first plurality of reset voltage pulses having ultimately a given maximum predetermined magnitude less than the maximum threshold voltage value of said memory device to produce reset current pulses of a first amplitude as long as the magnitude of the reset voltage remains in excess of the threshold voltage value of the memory device being reset; and
second means for applying a second plurality of reset voltage pulses having ultimately a given maximum predetermined magnitude greter than the maximum threshold voltage values of said memory device to produce reset current pulses of a second amplitude for each of the second plurality of reset voltage pulses.

18. The circuit of claim 17 wherein said first means and second means apply said first plurality of reset voltage pulses alternate with said second plurality of reset voltage pulses in said sequence respectively.

19. The circuit of claim 17 wherein said first current amplitude is at least twice said second amplitude.

20. The circuit of claim 19 wherein said second current amplitude is at least twice the amplitude of the current produced by said set voltage pulses.

21. The circuit of claim 17 wherein said first plurality of reset voltage pulses have a maximum amplitude of no greater than 80 percent of said given threshold voltage value.

* * * * *

UNITED STATES PATENT AND TRADEMARK OFFICE
CERTIFICATE OF CORRECTION

PATENT NO. : 4,228,524

DATED : October 14, 1980

INVENTOR(S) : Ronald G. Neale, et al

It is certified that error appears in the above-identified patent and that said Letters Patent are hereby corrected as shown below:

IN THE ABSTRACT, line 9, after the word "said" insert -- first amplitude --.

Column 1, line 59, change "degredation" to -- degradation --.

Column 1, line 61, change "crystalize" to -- crystallize --.

Column 2, line 2, change "severly" to -- severely --.

Column 2, line 21, delete the word "which" before degradation.

Column 2, line 36, change "stablize" to -- stabilize --.

Column 2, line 42, change "valve" to -- value --.

Column 2, line 56, change "stablize" to --stabilize--.

Column 2, line 65, change word "stablization" to -- stabilization --.

Column 2, line 67, change "stablization" to -- stabilization--.

Column 3, line 16, delete the second "than".

Column 3, line 25, change "intial" to -- initial --.

Column 3, line 33, change the "." to -- , -- .

UNITED STATES PATENT AND TRADEMARK OFFICE
CERTIFICATE OF CORRECTION

PATENT NO. : 4,228,524
DATED : October 14, 1980
INVENTOR(S) : Ronald G. Neale, et al It is certified that error appears in the above-identified patent and that said Letters Patent are hereby corrected as shown below:

Column 3, line 33, change "Namely" to -- namely --.

Column 4, line 38, change the "of" following "device" to -- to --.

Column 4, line 44, change "theshold" to -- threshold --.

Column 6, line 6, delete the first "to".

Column 6, line 6, change "extremeties" to -- extremities --.

Column 7, line 49, change "adapative" to -- adaptive --.

Column 8, line 13, change "give" to -- given --.

Column 8, line 19, change "consent" to -- constant --.

Column 8, line 55, after "voltage" insert -- value --.

Column 9, line 11, after "which" insert - extend --.

Column 9, line 32, change "give" to -- given --.

UNITED STATES PATENT AND TRADEMARK OFFICE
CERTIFICATE OF CORRECTION

PATENT NO. : 4,228,524

DATED : October 14, 1980

INVENTOR(S) : Ronald G. Neale, et al

It is certified that error appears in the above-identified patent and that said Letters Patent are hereby corrected as shown below:

Column 9, line 37, change "voltge" to -- voltage --.

Column 10, line 34, change "greter" to -- greater --.

Signed and Sealed this

Twenty-fourth Day of February 1981

[SEAL]

Attest:

RENE D. TEGTMEYER

Attesting Officer     Acting Commissioner of Patents and Trademarks